US010600825B2

(12) United States Patent
Zhang et al.

(10) Patent No.: US 10,600,825 B2
(45) Date of Patent: Mar. 24, 2020

(54) MANUFACTURING METHOD FOR TFT ARRAY SUBSTRATE AND TFT ARRAY SUBSTRATE

(71) Applicant: Shenzhen China Star Optoelectronics Technology Co., Ltd., Shenzhen (CN)

(72) Inventors: Ruijun Zhang, Shenzhen (CN); Song Wang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/098,441

(22) PCT Filed: Sep. 18, 2018

(86) PCT No.: PCT/CN2018/106342
§ 371 (c)(1),
(2) Date: Nov. 2, 2018

(87) PCT Pub. No.: WO2019/223195
PCT Pub. Date: Nov. 28, 2019

(65) Prior Publication Data
US 2019/0355767 A1    Nov. 21, 2019

(30) Foreign Application Priority Data

May 21, 2018   (CN) .......................... 2018 1 0488942

(51) Int. Cl.
*H01L 21/00* (2006.01)
*H01L 27/12* (2006.01)
*H01L 21/268* (2006.01)

(52) U.S. Cl.
CPC ........ *H01L 27/1285* (2013.01); *H01L 21/268* (2013.01); *H01L 27/1222* (2013.01); *H01L 27/1288* (2013.01)

(58) Field of Classification Search
CPC ............... H01L 27/1285; H01L 21/268; H01L 27/1222; H01L 27/1288
(Continued)

(56) References Cited

U.S. PATENT DOCUMENTS

| 2003/0183875 | A1 | 10/2003 | Isobe |
| 2010/0025684 | A1* | 2/2010 | Shinohara ........... H01L 21/0237 257/49 |
| 2015/0311388 | A1* | 10/2015 | Shimooka ............. H01L 33/007 257/615 |

FOREIGN PATENT DOCUMENTS

| CN | 103489788 A | 1/2014 |
| CN | 104064451 A | 9/2014 |

(Continued)

*Primary Examiner* — Brook Kebede
(74) *Attorney, Agent, or Firm* — Leong C. Lei

(57) ABSTRACT

The invention provides a manufacturing method for TFT array substrate and TFT array substrate. The manufacturing method forms a first buffer layer on the substrate; the first buffer layer is disposed with a plurality of arc protrusions or a plurality of arc recesses; then an a-Si layer is formed on the second buffer layer which is formed on the first buffer layer; in the process of forming a polysilicon layer by performing ELA on the a-Si layer, the arc protrusions or the arc recesses can change the optical path of the laser to form an energy gradient in the a-Si layer, so as to increase the grain size in the formed polysilicon layer, reduce the number of grain boundaries, improve the carrier mobility of the TFT device, and improve the electrical properties of the TFT device.

9 Claims, 13 Drawing Sheets

(58) Field of Classification Search
USPC .................................................. 438/149–167
See application file for complete search history.

(56) References Cited

FOREIGN PATENT DOCUMENTS

| CN | 104362084 A | 2/2015 |
|----|-------------|--------|
| CN | 106024708 A | 10/2016 |

* cited by examiner

MANUFACTURING METHOD FOR TFT ARRAY SUBSTRATE AND TFT ARRAY SUBSTRATE

BACKGROUND OF THE INVENTION

1. Field of the Invention

The present invention relates to the field of display, and in particular to a thin film transistor (TFT) array substrate and liquid crystal display (LCD).

2. The Related Arts

In the field of display technology, a panel display device, such as liquid crystal display (LCD), organic light-emitting diode (OLED) display device, has gradually replaced a cathode ray tube (CRT) display device. The LCD has many advantages such as thinness, power saving, no radiation, and so on, and has been widely used.

A conventional display device is generally provided with a thin film transistor (TFT) array substrate as a driving structure, and the TFT array substrate comprises a plurality of TFT devices arranged in an array. The performance of the TFT array substrate greatly affects the quality of the display device. With the continuous development of panel display technology, high-resolution and low-energy display devices are increasingly favored by consumers. Low temperature poly-silicon (LTPS) device can be fabricated at low temperatures and has high electron mobility, so that TFT array substrates fabricated with LTPS are often used in display devices to achieve high resolution of display devices and low energy.

The known methods for producing LTPS include solid phase crystallization (SPC), metal induced crystallization (MIC), and excimer laser annealing (ELA); wherein the ELA is currently the most widely used method. In the known method for preparing LTPS by excimer laser annealing, a buffer layer is generally formed on the substrate, and then an amorphous silicon layer is formed on the buffer layer, then the amorphous silicon layer is subjected to high temperature dehydrogenation treatment, the ELA equipment performs laser scanning on the amorphous silicon layer, and the amorphous silicon layer receives the laser energy, melts and then recrystallizes to form a polysilicon layer. In the process of recrystallization, the direction of the crystallization is from low energy to high energy. That is, from the low temperature to the high temperature. Therefore, the starting point and direction of crystallization in the current amorphous silicon layer are disordered, resulting in small grain size and many boundaries between crystal grains in recrystallization of the polysilicon layer, which affect the carrier mobility of the polysilicon layer.

SUMMARY OF THE INVENTION

The object of the present invention is to provide a manufacturing method for TFT array substrate, able to increase the size of crystal grains in the active layer, reduce the number of grain boundaries, improve the carrier mobility of TFT device, and improve the electrical properties of the TFT device.

Another object of the present invention is to provide a TFT array substrate, having large size of crystal grains in the active layer, less number of grain boundaries, higher carrier mobility of TFT device, and better electrical properties of the TFT device.

To achieve the above object, the present invention provides a manufacturing method for TFT array substrate, which comprises:

providing a substrate;

forming a first buffer layer on the substrate; the first buffer layer being disposed with a plurality of arc protrusions or a plurality of arc recesses;

forming a second buffer layer on the first buffer layer; forming an amorphous silicon (a-Si) layer on the second buffer layer, performing an excimer laser annealing (ELA) on the a-Si layer to form a polysilicon layer; and patterning the polysilicon layer to form a plurality of active layers respectively located above the plurality of arc protrusions or the plurality of arc recesses.

Wherein, the first buffer layer is made of a material of silicon nitride or silicon oxide and has a thickness of 3000-8000 Å.

Optionally, the step of forming a buffer layer specifically comprises:

forming a buffer material layer on the substrate;

coating a positive photoresist material on the buffer material layer to form a photoresist material layer;

providing a halftone mask (HTM) comprising a plurality of spaced semi-transmissive regions and a fully-transmissive region outside the semi-transmissive region; in the semi-transmissive region, transmittance gradually increasing from center of the semi-transmissive region to peripheral, and amplitude of the increase in transmittance gradually increasing from the center of the semi-transmissive region to the peripheral;

performing an exposure and development process on the photoresist material layer by using the HTM to form a plurality of photoresist patterns, the photoresist pattern having a top surface of arc shape;

performing dry etching with dry etching gas on the plurality of photoresist patterns and the buffer material layer to form the first buffer layer; and the first buffer layer being disposed with a plurality of arc protrusions.

Optionally, the step of forming a buffer layer specifically comprises:

forming a buffer material layer on the substrate;

coating a positive photoresist material on the buffer material layer to form a photoresist material layer;

providing a halftone mask (HTM) comprising a plurality of spaced semi-transmissive regions and a fully-transmissive region outside the semi-transmissive region; in the semi-transmissive region, transmittance gradually decreasing from center of the semi-transmissive region to peripheral, and amplitude of the decrease in transmittance gradually decreasing from the center of the semi-transmissive region to the peripheral;

performing an exposure and development process on the photoresist material layer by using the HTM to form a plurality of arc pits on the photoresist material layer;

performing dry etching with dry etching gas on the photoresist material layer with pits and the buffer material layer to form the first buffer layer; and the first buffer layer being disposed with a plurality of arc recesses.

Wherein, the dry etching gas is oxygen with sulfur hexafluoride.

Wherein, in the dry etching gas, the ratio of oxygen to sulfur hexafluoride is 10:1.

Wherein, the second buffer layer is made of silicon oxide and has a thickness of 3000-8000 Å.

Wherein, the manufacturing method for TFT array substrate further comprises: performing ion doping on the active layer to form a channel region in middle of the active layer, a heavily doped region at both ends of the active layer, and a lightly doped region between the channel region and the heavy doped regions; forming a gate insulating layer on the plurality of active layers; and forming a plurality of gates on the gate insulating layer respectively over the channel regions of the plurality of active layers; forming an interlayer insulating layer on the second buffer layer, the plurality of gates and the gate insulating layer; patterning the interlayer insulating layer and the gate insulating layer to form a plurality of vias respectively exposing the heavily doped regions at the two ends of the active layer; forming a plurality of sources and drains on the interlayer insulating layer; having each of the sources and drains connected to a heavily doped region at one end of an active layer through a via.

Wherein, a projection of the channel region of the active layer in a vertical direction coincides with an edge of the arc protrusion or arc recess below the active layer.

The present invention also provides a TFT array substrate, which comprises: a substrate, a first buffer layer disposed on the substrate, a second buffer layer disposed on the first buffer layer and a plurality of active layers disposed on the second buffer layer;

the first buffer layer being disposed with a plurality of arc protrusions or arc recesses;

the plurality of active layers being located respectively above the plurality of arc protrusions or arc recesses.

The present invention provides the following advantages: the manufacturing method for TFT array substrate provided by the present invention forms a first buffer layer on the substrate; the first buffer layer is disposed with a plurality of arc protrusions or a plurality of arc recesses; then an a-Si layer is formed on the second buffer layer which is formed on the first buffer layer; in the process of forming a polysilicon layer by performing ELA on the a-Si layer, the arc protrusions or the arc recesses can change the optical path of the laser to form an energy gradient in the a-Si layer, so as to increase the grain size in the formed polysilicon layer, reduce the number of grain boundaries, improve the carrier mobility of the TFT device, and improve the electrical properties of the TFT device. The active layer of the TFT array substrate provided by the present invention has a large crystal grain size and a small number of grain boundaries, and the TFT device has high carrier mobility and good electrical properties.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
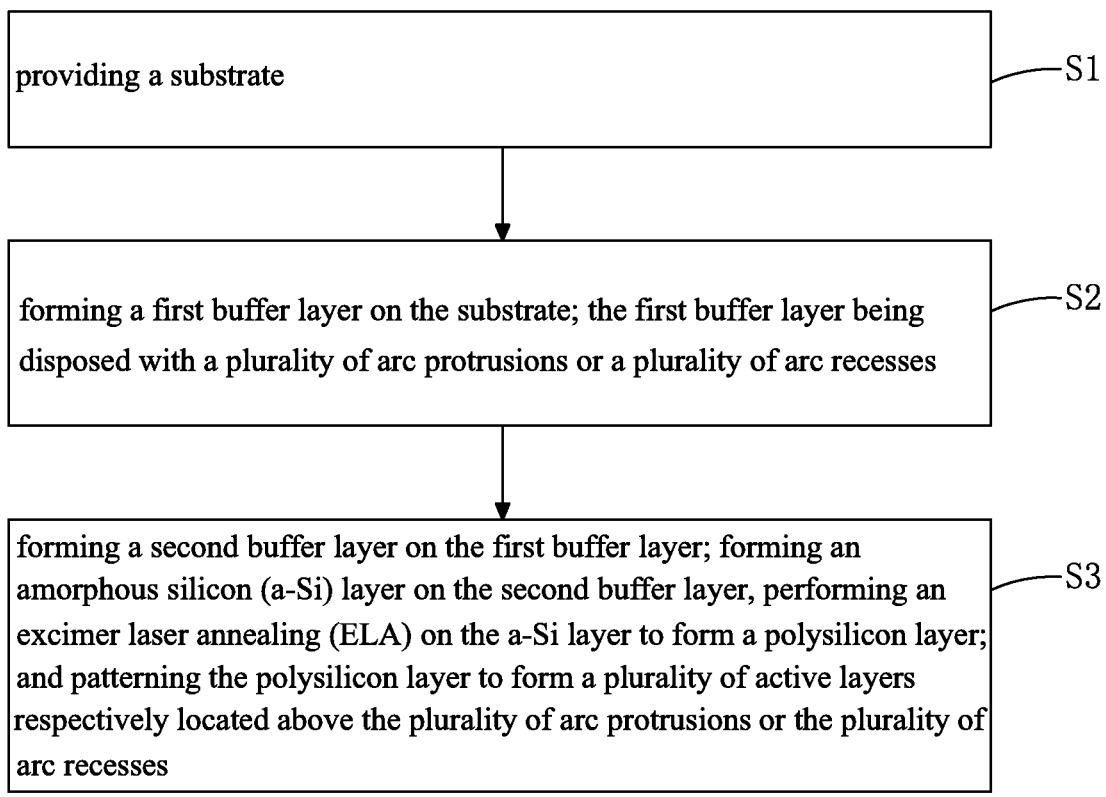
FIG. 1 is a schematic view showing the flowchart of the manufacturing method for TFT array substrate of the present invention.
Figure 2:
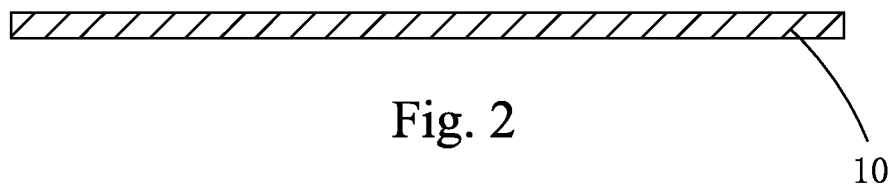
FIG. 2 is a schematic view showing step S1 of the manufacturing method for TFT array substrate of the present invention.

Refer to FIG. 1, as well as FIG. 2 to FIG. 11. The manufacturing method for TFT array substrate of the first embodiment of the present invention comprises the following steps:

Step S1: as shown in FIG. 2, providing a substrate 10.

Specifically, the substrate 10 can be made of glass or a flexible material.

Figure 6:
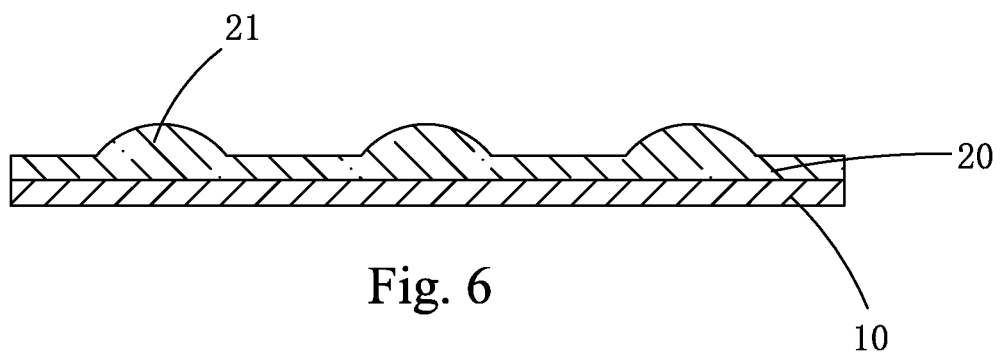

Step S2: as shown in FIG. 6, forming a first buffer layer 20 on the substrate 10. The first buffer layer 20 is disposed with a plurality of arc protrusions 21.

Specifically, the material for the first buffer layer 20 can be SiNx, SiOx, or other materials often used as buffer layer in the TFT array substrate.

Specifically, the first buffer layer is made of a material of silicon nitride or silicon oxide and has a thickness of 3000-8000 Å, and preferably, 5000 Å.

Specifically, in the first embodiment of the present invention, the first buffer layer 20 having a plurality of arc protrusions 21 is formed by a lithographic process and etching. Of course, in other embodiments of the present invention, other methods for forming protrusions on a film layer commonly used in the prior art may also be used to form the first buffer layer 20.

Figure 3:
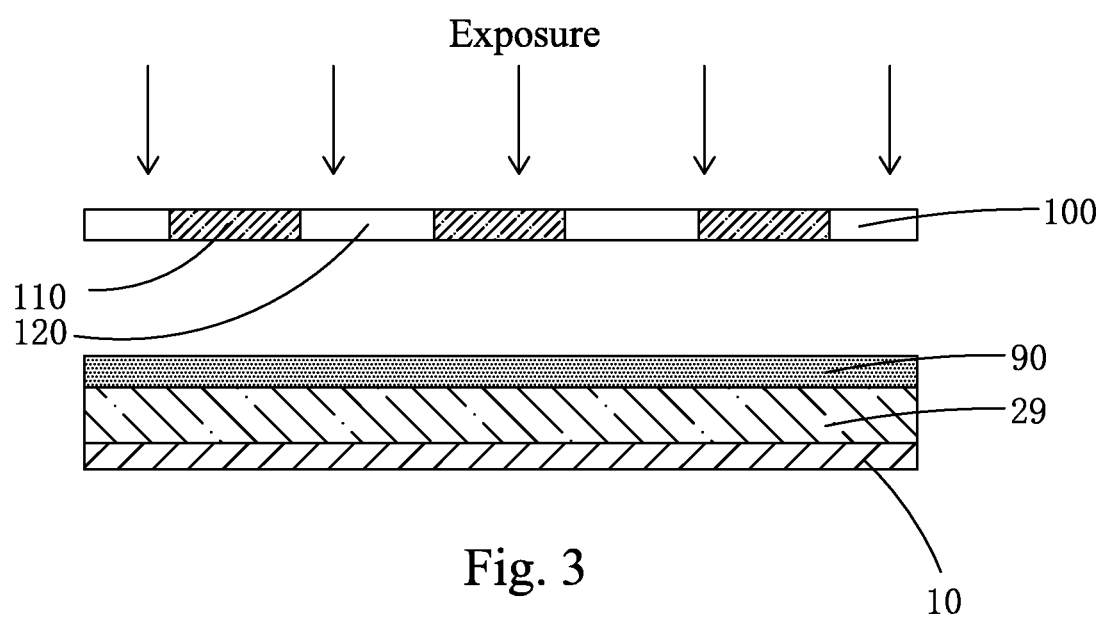
FIGS. 3-6 are schematic views showing step S2 of the manufacturing method for TFT array substrate of the first embodiment of the present invention.

Moreover, in the first embodiment of the present invention, in step S2, the use of the lithographic process with etching to form the first buffer layer 20 on the substrate 10 specifically comprises:

First, referring to FIG. 3, forming a buffer material layer 29 on the substrate 10; coating a positive photoresist material on the buffer material layer 29 to form a photoresist material layer 90.

Then, referring to FIG. 3, providing a halftone mask (HTM) 100 comprising a plurality of spaced semi-transmissive regions 110 and a fully-transmissive region 120 outside the semi-transmissive region 110; in the semi-transmissive region 110, transmittance gradually increasing from center of the semi-transmissive region 110 to peripheral, and amplitude of the increase in transmittance gradually increasing from the center of the semi-transmissive region 110 to the peripheral. The HTM 100 is used to perform an exposure and development process on the photoresist material layer

Figure 4:
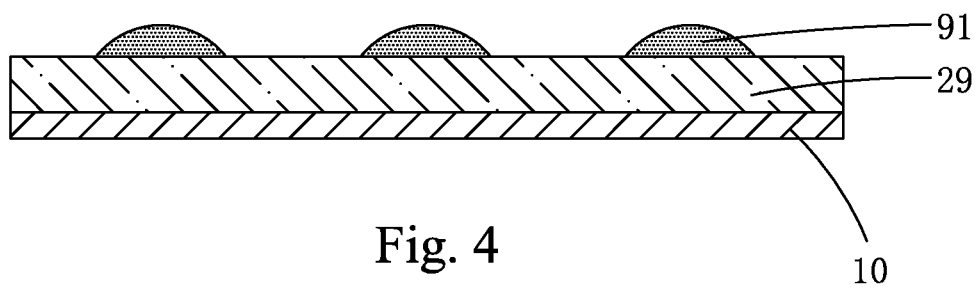

90. As shown in FIG. 4, a plurality of photoresist patterns 91 are formed, and the top surface of the photoresist pattern 91 has an arc shape.

Figure 5:
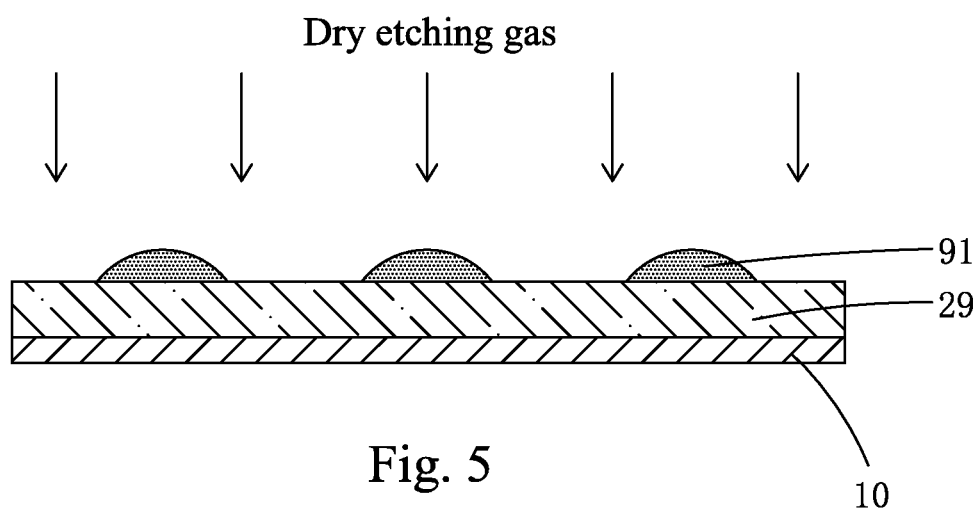

Then, referring to FIG. 5, performing dry etching with dry etching gas on the plurality of photoresist patterns 91 and the buffer material layer 29. The plurality of photoresist patterns 91 and the buffer material layer 29 will be thinned by the dry etching gas, as shown in FIG. 6, to form the first buffer layer 20 disposed with a plurality of arc protrusions 21. The plurality of arc protrusions 21 are used to reflect the laser light to the portion other than the portion corresponding to the plurality of arc protrusions 21 when the a-Si layer formed on the first buffer layer 20 is subsequently subjected to ELA treatment. The portion of the a-Si layer corresponding to the plurality of arc protrusions 21 absorbs less energy than the other portions of the a-Si layer, so that an energy gradient is formed between the portion of the a-Si layer corresponding to the plurality of arc protrusions 21 and the other portions of the a-Si layer. Therefore, the crystallization orientation of the a-Si layer can be controlled to increase the grain size of the resulting polysilicon layer.

Specifically, the dry etching gas used to dry etch the plurality of photoresist patterns 91 and the buffer material layer 29 is, but not limited to, oxygen (O2) with sulfur hexafluoride (SF6).

Moreover, when the dry etching gas is O2+SF6, the ratio of oxygen to sulfur hexafluoride is 10:1.

Figure 7:
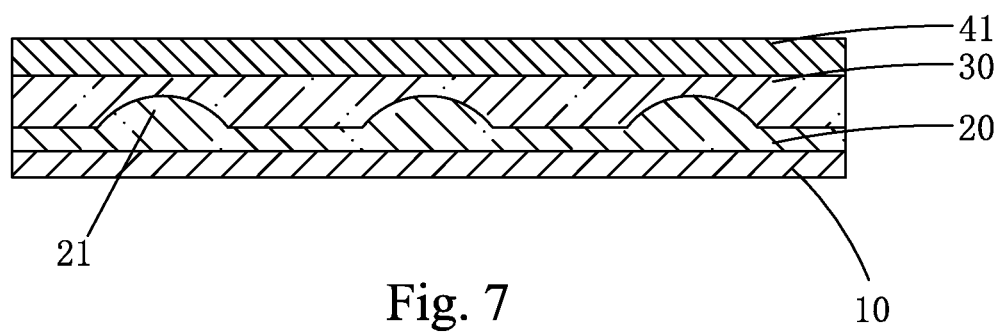
FIGS. 7-10 are schematic views showing step S3 of the manufacturing method for TFT array substrate of the first embodiment of the present invention.
Figure 8:
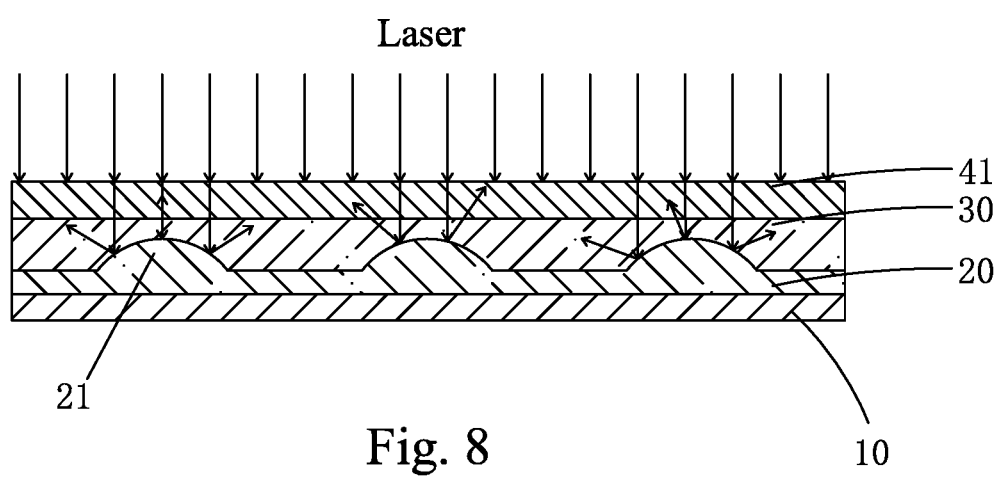
Figure 9:
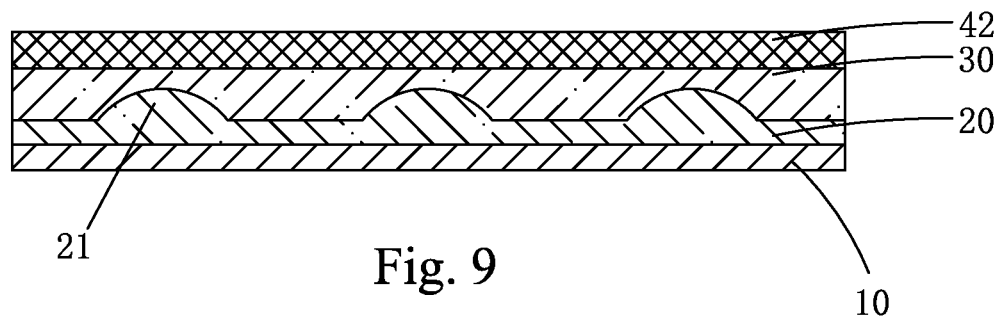
Figure 10:
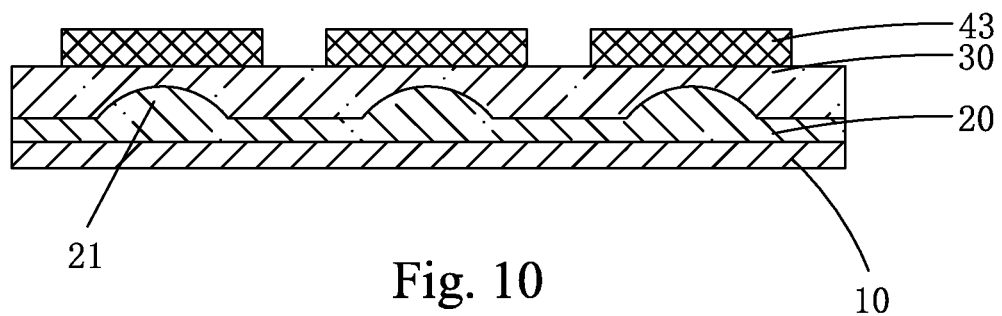

Step S3: as shown in FIG. 7, forming a second buffer layer 30 on the first buffer layer 20; forming an amorphous silicon (a-Si) layer 41 on the second buffer layer 30; referring to FIG. 8 and FIG. 9, performing an excimer laser annealing (ELA) on the a-Si layer 41 to form a polysilicon layer 42; and patterning the polysilicon layer 42, as shown in FIG. 10, to form a plurality of active layers 43 respectively located above the plurality of arc protrusions 21.

Specifically, the material for the second buffer layer 30 can be SiOx or other materials often used as buffer layer in the TFT array substrate. The second buffer layer has a thickness of 3000-8000 Å.

Figure 11:
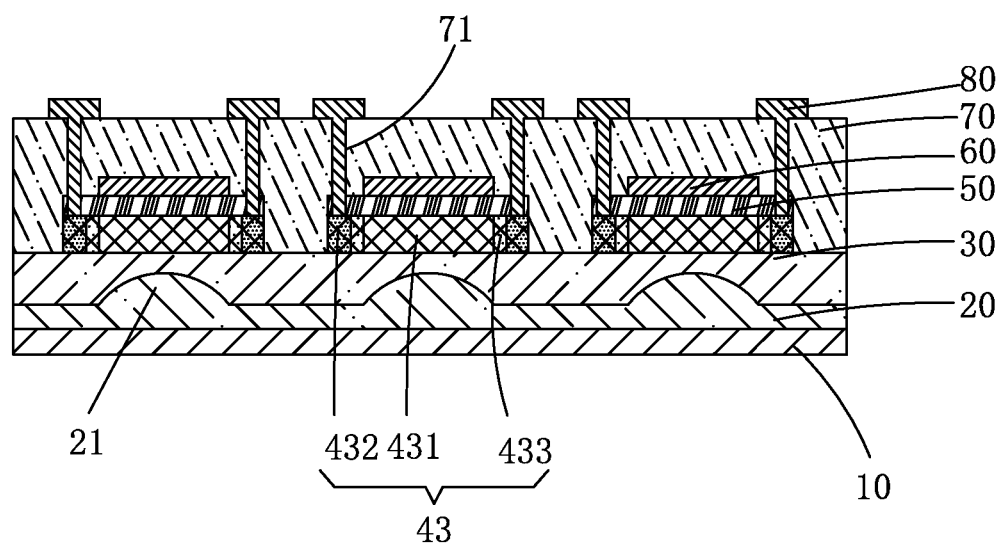
FIG. 11 is a schematic view showing step S4 of the manufacturing method for TFT array substrate and the TFT array substrate of the first embodiment of the present invention.

Step S4: as shown in FIG. 11, performing ion doping on the active layer 43 to form a channel region 431 in middle of the active layer 43, a heavily doped region 432 at both ends of the active layer 43, and a lightly doped region 433 between the channel region 431 and the heavy doped regions 432; forming a gate insulating layer 50 on the plurality of active layers 43.

Then, forming a plurality of gates 60 on the gate insulating layer 50 respectively over the channel regions 431 of the plurality of active layers 43; forming an interlayer insulating layer 70 on the second buffer layer 30, the plurality of gates 60 and the gate insulating layer 50; patterning the interlayer insulating layer 70 and the gate insulating layer 50 to form a plurality of vias 71 respectively exposing the heavily doped regions 432 at the two ends of the active layer 43; forming a plurality of sources and drains 80 on the interlayer insulating layer 70; having each of the sources and drains 80 connected to a heavily doped region 432 at one end of an active layer 43 through a via 71. The active layer 43 together with the gate 60 and the source/drain 80 forms a TFT device.

Preferably, the projection of the channel region 431 of the active layer 43 in a vertical direction coincides with an edge of the arc protrusion 21 below the active layer 43.

It should be noted that, referring to FIG. 7 and FIG. 8, in the manufacturing method for TFT array substrate of the first embodiment of the present invention, because the first buffer layer 20 is disposed with the plurality of arc protrusions 21, in step S3, when performing ELA treatment with laser irradiation on the a-Si layer 41, the laser is reflected by the plurality of arc protrusions 21 to the portion other than the portion corresponding to the plurality of arc protrusions 21. The portion of the a-Si layer 41 corresponding to the plurality of arc protrusions 21 absorbs less energy than the other portions of the a-Si layer, so that an energy gradient is formed between the portion of the a-Si layer 41 corresponding to the plurality of arc protrusions 21 and the other portions of the a-Si layer. Therefore, the crystallization orientation of the a-Si layer 41 can be controlled. Compared with the prior art, the present invention can increase the grain size in the formed polysilicon layer 42 and reduce the number of grain boundaries. Therefore, after the polysilicon layer 42 is patterned to form an active layer 43 above the plurality of arc protrusions 21 and subsequently fabricates the gate 60 and the source/drain 80 to form a TFT device, the TFT device has high carrier mobility and good electrical properties, thereby effectively improving the quality of the product.

Figure 13:
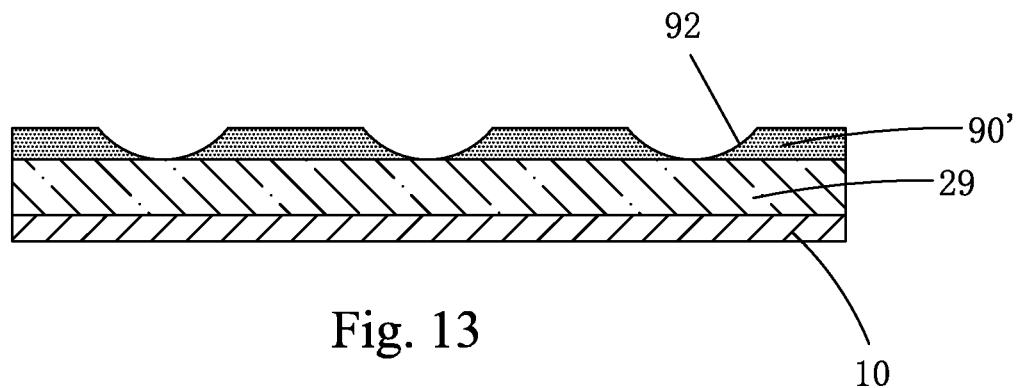
Figure 14:
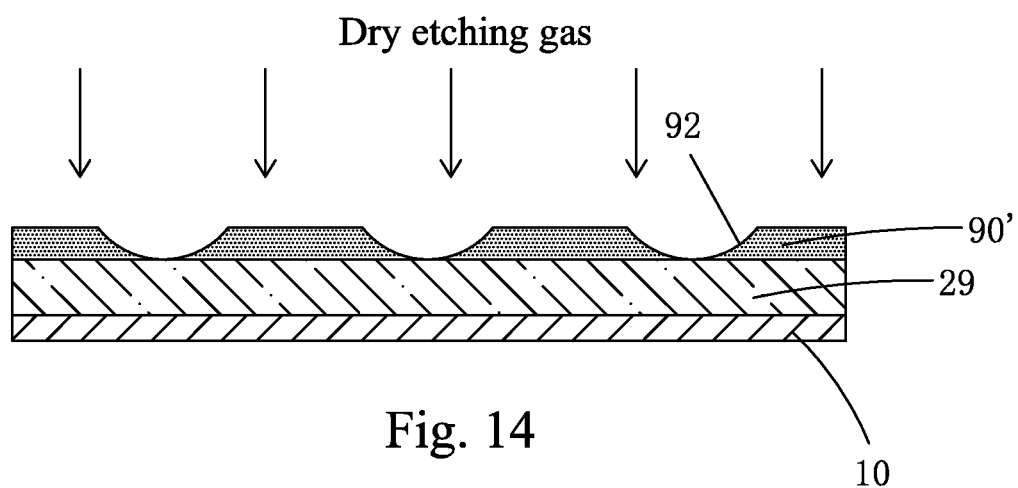
Figure 15:
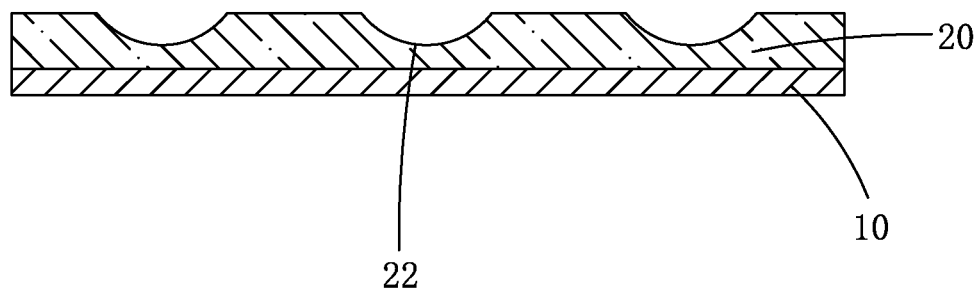
Figure 16:
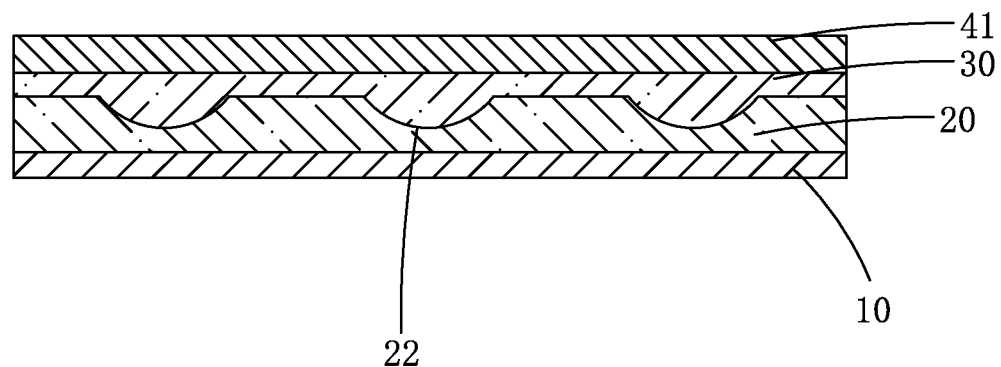
FIGS. 16-19 are schematic views showing step S3 of the manufacturing method for TFT array substrate of the second embodiment of the present invention.

Refer to FIG. 1, as well as FIG. 2 and FIGS. 12-20. The manufacturing method for TFT array substrate of the second embodiment of the present invention differs from the first embodiment in that, as shown in FIG. 15, the first buffer layer 20 formed in step S2 comprises a plurality of arc recesses 22.

Specifically, in the second embodiment of the present invention, the first buffer layer 20 having a plurality of arc recesses 22 is formed by a lithographic process and etching. Of course, in other embodiments of the present invention, other methods for forming recesses on a film layer commonly used in the prior art may also be used to form the first buffer layer 20.

Figure 12:
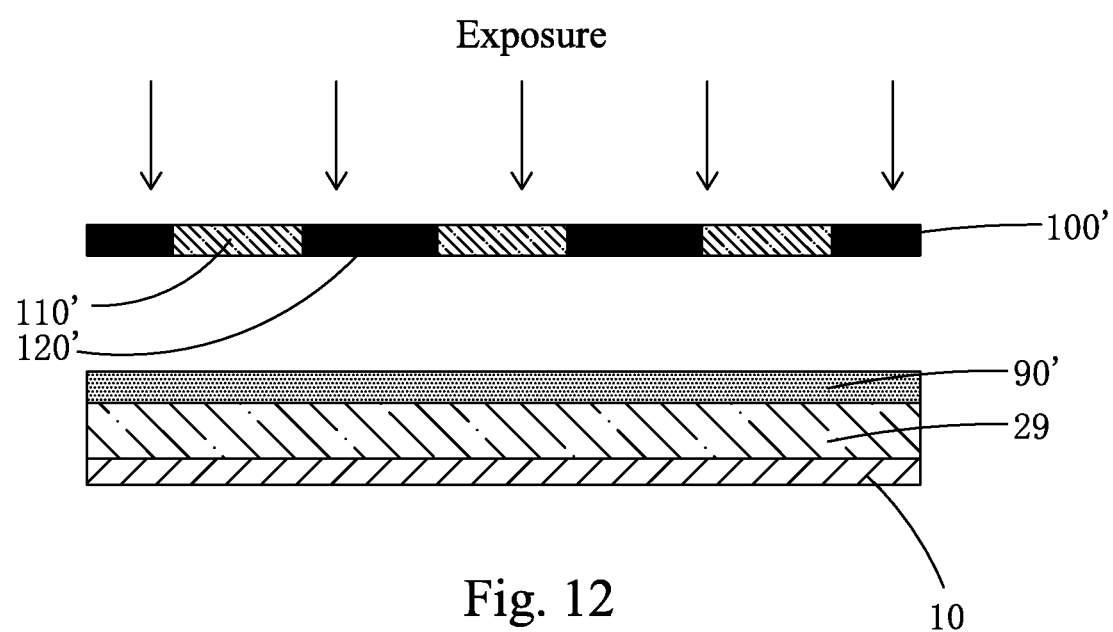
FIGS. 12-15 are schematic views showing step S2 of the manufacturing method for TFT array substrate of the second embodiment of the present invention.

Moreover, in the second embodiment of the present invention, in step S2, the use of the lithographic process with etching to form the first buffer layer 20 on the substrate 10 specifically comprises:

First, referring to FIG. 12, forming a buffer material layer 29 on the substrate 10; coating a positive photoresist material on the buffer material layer 29 to form a photoresist material layer 90'.

Then, referring to FIG. 12, providing a halftone mask (HTM) 100' comprising a plurality of spaced semi-transmissive regions 110' and a fully-transmissive region 120' outside the semi-transmissive region 110'; in the semi-transmissive region 110', transmittance gradually decreasing from center of the semi-transmissive region 110' to peripheral, and amplitude of the decrease in transmittance gradually decreasing from the center of the semi-transmissive region 110' to the peripheral. The HTM 100' is used to perform an exposure and development process on the photoresist material layer 90'. As shown in FIG. 13, a plurality of arc pits 92 are formed on the photoresist material layer 90'.

Then, referring to FIG. 14, performing dry etching with dry etching gas on the photoresist material layer 90' with arc pits 92 and the buffer material layer 29. The photoresist material layer 90' with arc pits 92 and the buffer material layer 29 will be thinned by the dry etching gas, as shown in FIG. 15, to form the first buffer layer 20 disposed with a plurality of arc recesses 22.

Figure 19:
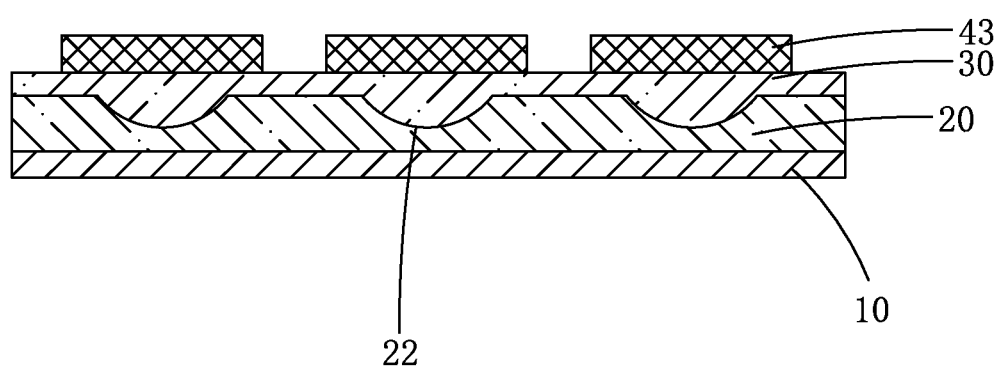

Moreover, as shown in FIG. 19, in the second embodiment of the present invention, in step S3, the a-Si layer 42 is patterned to form a plurality of active layer 43 located respectively above the plurality of arc recesses 22.

Figure 20:
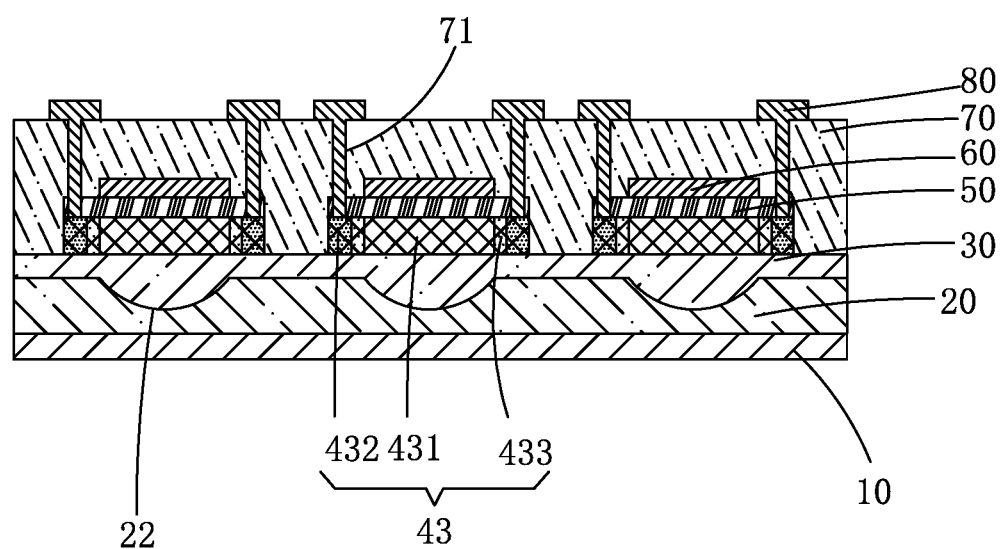
FIG. 20 is a schematic view showing step S4 of the manufacturing method for TFT array substrate and the TFT array substrate of the second embodiment of the present invention.

Moreover, as shown in FIG. 20, in the second embodiment of the present invention, in step S4, the projection of the channel region 431 of the active layer 43 in a vertical direction coincides with an edge of the arc recess 22 below the active layer 43.

The remaining is the same as the first embodiment and the detailed description will not be repeated herein.

Figure 17:
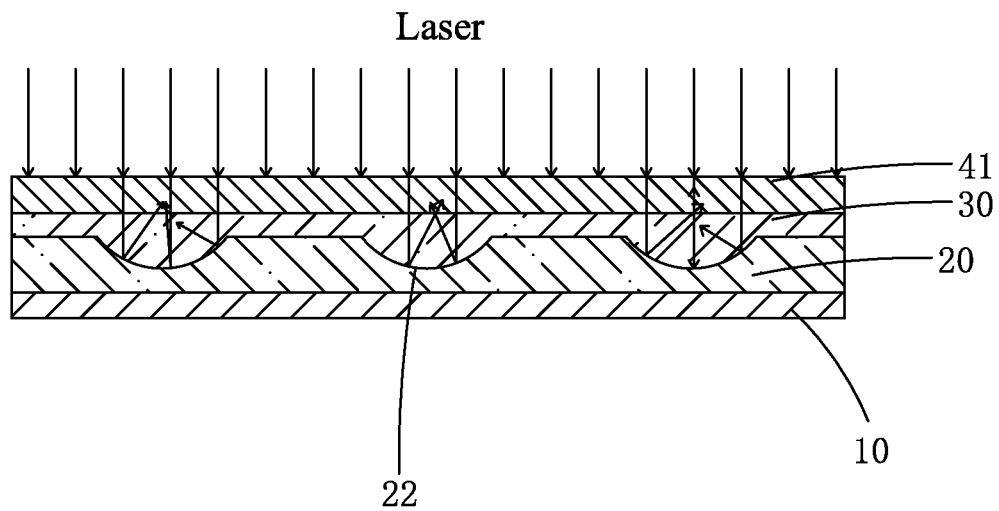
Figure 18:
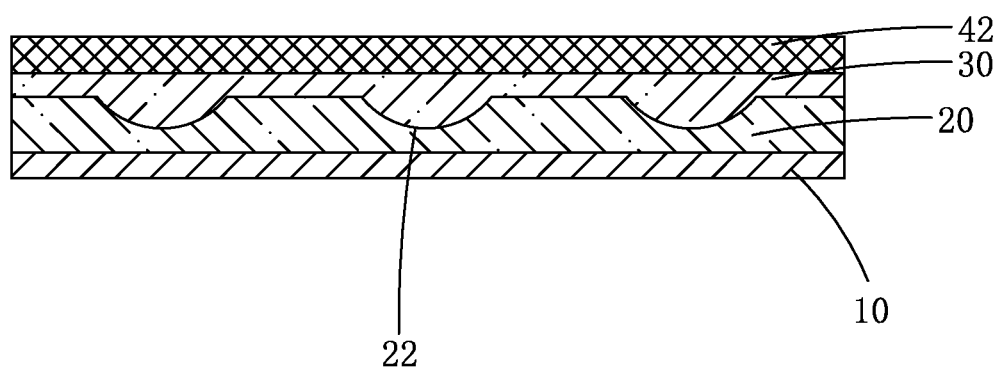

It should be noted that, referring to FIG. 17 and FIG. 18, in the manufacturing method for TFT array substrate of the second embodiment of the present invention, because the first buffer layer 20 is disposed with the plurality of arc recesses 22, in step S3, when performing ELA treatment with laser irradiation on the a-Si layer 41, the laser is reflected by the plurality of arc recesses 22 to the portion other than the portion corresponding to the plurality of arc recesses 22. The portion of the a-Si layer 41 corresponding to the plurality of arc protrusions 21 absorbs less energy than the other portions of the a-Si layer, so that an energy gradient is formed between the portion of the a-Si layer 41 corresponding to the plurality of arc recesses 22 and the other portions of the a-Si layer 41. Therefore, the crystallization orientation of the a-Si layer 41 can be controlled. Compared with the prior art, the present invention can increase the grain size in the formed polysilicon layer 42 and reduce the number of grain boundaries. Therefore, after the polysilicon layer 42 is patterned to form an active layer 43 above the plurality of arc recesses 22 and subsequently fabricates the gate 60 and the source/drain 80 to form a TFT device, the TFT device has high carrier mobility and good electrical properties, thereby effectively improving the quality of the product.

Refer to FIG. 11. The TFT array substrate of the first embodiment of the present invention is fabricated by the above manufacturing method for TFT array substrate, comprising: a substrate 10, a first buffer layer 20 disposed on the substrate 10, a second buffer layer 30 disposed on the first buffer layer 20 and a plurality of active layers 43 disposed on the second buffer layer 30. The first buffer layer 20 is disposed with a plurality of arc protrusions 21, and the plurality of active layers 43 are located respectively above the plurality of arc protrusions 21.

Specifically, The TFT array substrate of the first embodiment of the present invention further comprises a gate insulating layer 50 disposed on the on the plurality of active layers 43, a plurality of gates 60 disposed on the gate insulating layer 50 respectively over the channel regions 431 of the plurality of active layers 43; an interlayer insulating layer 70 covering the second buffer layer 30, the plurality of gates 60 and the gate insulating layer 50, and a plurality of sources and drains 80 on the interlayer insulating layer 70. The active layer 43 comprises a channel region 431 at the middle, a heavily doped region 432 at both end of the active layer 43, and a lightly doped region 433 between the channel region and the heavily doped regions. The gates 60 on the active layer 43 is above the channel region 431. The interlayer insulating layer 70 and the gate insulating layer 50 are disposed with a plurality of vias 71 respectively exposing the heavily doped regions 432 at the two ends of the active layer 43. Each of the sources and drains 80 is connected to a heavily doped region 432 at one end of an active layer 43 through a via 71.

Preferably, the projection of the channel region 431 of the active layer 43 in a vertical direction coincides with an edge of the arc protrusion 21 below the active layer 43.

It should be noted that in the TFT array substrate of the first embodiment of the present invention, because the first buffer layer 20 is disposed with the plurality of arc protrusions 21, when performing ELA treatment with laser irradiation on the a-Si layer 41, the laser is reflected by the plurality of arc protrusions 21 to the portion other than the portion corresponding to the plurality of arc protrusions 21. The portion of the a-Si layer 41 corresponding to the plurality of arc protrusions 21 absorbs less energy than the other portions of the a-Si layer, so that an energy gradient is formed between the portion of the a-Si layer 41 corresponding to the plurality of arc protrusions 21 and the other portions of the a-Si layer. Therefore, the crystallization orientation of the a-Si layer 41 can be controlled. Compared with the prior art, the present invention can increase the grain size in the formed polysilicon layer 42 and reduce the number of grain boundaries. Therefore, after the polysilicon layer 42 is patterned to form an active layer 43 above the plurality of arc protrusions 21 and subsequently fabricates the gate 60 and the source/drain 80 to form a TFT device, the TFT device has high carrier mobility and good electrical properties, thereby effectively improving the quality of the product.

Refer to FIG. 20. The TFT array substrate of the second embodiment of the present invention is fabricated by the above manufacturing method for TFT array substrate and differs from the first embodiment is that the first buffer layer 20 is disposed with a plurality of arc recesses 22. The plurality of active layers 43 are located respectively above the plurality of arc recesses 22.

Preferably, the projection of the channel region 431 of the active layer 43 in a vertical direction coincides with an edge of the arc recess 22 below the active layer 43.

The remaining is the same as the first embodiment and the detailed description will not be repeated herein.

It should be noted that in the TFT array substrate of the second embodiment of the present invention, because the first buffer layer 20 is disposed with the plurality of arc recesses 22, when performing ELA treatment with laser irradiation on the a-Si layer 41, the laser is reflected by the plurality of arc recesses 22 to the portion other than the portion corresponding to the plurality of arc recesses 22. The portion of the a-Si layer 41 corresponding to the plurality of arc protrusions 21 absorbs less energy than the other portions of the a-Si layer, so that an energy gradient is formed between the portion of the a-Si layer 41 corresponding to the plurality of arc recesses 22 and the other portions of the a-Si layer 41. Therefore, the crystallization orientation of the a-Si layer 41 can be controlled. Compared with the prior art, the present invention can increase the grain size in the formed polysilicon layer 42 and reduce the number of grain boundaries. Therefore, after the polysilicon layer 42 is patterned to form an active layer 43 above the plurality of arc recesses 22 and subsequently fabricates the gate 60 and the source/drain 80 to form a TFT device, the TFT device has high carrier mobility and good electrical properties, thereby effectively improving the quality of the product.

In summary, the manufacturing method for TFT array substrate provided by the present invention forms a first buffer layer on the substrate; the first buffer layer is disposed with a plurality of arc protrusions or a plurality of arc recesses; then an a-Si layer is formed on the second buffer layer which is formed on the first buffer layer; in the process of forming a polysilicon layer by performing ELA on the a-Si layer, the arc protrusions or the arc recesses can change the optical path of the laser to form an energy gradient in the a-Si layer, so as to increase the grain size in the formed polysilicon layer, reduce the number of grain boundaries, improve the carrier mobility of the TFT device, and improve the electrical properties of the TFT device. The active layer of the TFT array substrate provided by the present invention has a large crystal grain size and a small number of grain boundaries, and the TFT device has high carrier mobility and good electrical properties.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claim of the present invention.

What is claimed is:

1. A manufacturing method for thin film transistor (TFT) array substrate, comprising:
    providing a substrate;
    forming a first buffer layer on the substrate; the first buffer layer being disposed with a plurality of arc protrusions or a plurality of arc recesses;
    forming a second buffer layer on the first buffer layer;
    forming an amorphous silicon (a-Si) layer on the second buffer layer, performing an excimer laser annealing (ELA) on the a-Si layer to form a polysilicon layer; and
    patterning the polysilicon layer to form a plurality of active layers respectively located above the plurality of arc protrusions or the plurality of arc recesses.

2. The manufacturing method for TFT array substrate as claimed in claim 1, wherein the first buffer layer is made of a material of silicon nitride or silicon oxide and has a thickness of 3000-8000 Å.

3. The manufacturing method for TFT array substrate as claimed in claim 1, wherein the step of forming a buffer layer specifically comprises:
    forming a buffer material layer on the substrate;
    coating a positive photoresist material on the buffer material layer to form a photoresist material layer;
    providing a halftone mask (HTM) comprising a plurality of spaced semi-transmissive regions and a fully-transmissive region outside the semi-transmissive region; in the semi-transmissive region, transmittance gradually increasing from center of the semi-transmissive region to peripheral, and amplitude of the increase in transmittance gradually increasing from the center of the semi-transmissive region to the peripheral;
    performing an exposure and development process on the photoresist material layer by using the HTM to form a plurality of photoresist patterns, the photoresist pattern having a top surface of arc shape;
    performing dry etching with dry etching gas on the plurality of photoresist patterns and the buffer material layer to form the first buffer layer; and the first buffer layer being disposed with the plurality of arc protrusions.

4. The manufacturing method for TFT array substrate as claimed in claim 1, wherein the step of forming a buffer layer specifically comprises:
    forming a buffer material layer on the substrate;
    coating a positive photoresist material on the buffer material layer to form a photoresist material layer;
    providing a halftone mask (HTM) comprising a plurality of spaced semi-transmissive regions and a fully-transmissive region outside the semi-transmissive region; in the semi-transmissive region, transmittance gradually decreasing from center of the semi-transmissive region to peripheral, and amplitude of the decrease in transmittance gradually decreasing from the center of the semi-transmissive region to the peripheral;
    performing an exposure and development process on the photoresist material layer by using the HTM to form a plurality of arc pits on the photoresist material layer;
    performing dry etching with dry etching gas on the photoresist material layer with pits and the buffer material layer to form the first buffer layer; and the first buffer layer being disposed with a plurality of arc recesses.

5. The manufacturing method for TFT array substrate as claimed in claim 3, wherein the dry etching gas is oxygen with sulfur hexafluoride.

6. The manufacturing method for TFT array substrate as claimed in claim 4, wherein in the dry etching gas, the ratio of oxygen to sulfur hexafluoride is 10:1.

7. The manufacturing method for TFT array substrate as claimed in claim 1, wherein the second buffer layer is made of silicon oxide and has a thickness of 3000-8000 Å.

8. The manufacturing method for TFT array substrate as claimed in claim 1, wherein the manufacturing method for TFT array substrate further comprises: performing ion doping on the active layer to form a channel region in middle of the active layer, a heavily doped region at both ends of the active layer, and a lightly doped region between the channel region and the heavy doped regions; forming a gate insulating layer on the plurality of active layers; and forming a plurality of gates on the gate insulating layer respectively over the channel regions of the plurality of active layers; forming an interlayer insulating layer on the second buffer layer, the plurality of gates and the gate insulating layer; patterning the interlayer insulating layer and the gate insulating layer to form a plurality of vias respectively exposing the heavily doped regions at the two ends of the active layer; forming a plurality of sources and drains on the interlayer insulating layer; having each of the sources and drains connected to a heavily doped region at one end of an active layer through a via.

9. The manufacturing method for TFT array substrate as claimed in claim 8, wherein a projection of the channel region of the active layer in a vertical direction coincides with an edge of the arc protrusion or arc recess below the active layer.

* * * * *